United States Patent
Chang et al.

(10) Patent No.: US 11,244,829 B2
(45) Date of Patent: Feb. 8, 2022

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Yu-Cheng Tung, Kaohsiung (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 16/136,265

(22) Filed: Sep. 20, 2018

(65) Prior Publication Data
US 2020/0043733 A1     Feb. 6, 2020

(30) Foreign Application Priority Data
Aug. 3, 2018   (CN) .......................... 201810875849.1

(51) Int. Cl.
*H01L 21/308*   (2006.01)
*H01L 21/033*   (2006.01)
(Continued)

(52) U.S. Cl.
CPC ...... *H01L 21/0337* (2013.01); *H01L 27/1085* (2013.01); *H01L 21/32139* (2013.01)

(58) Field of Classification Search
CPC ........... H01L 21/0337; H01L 21/32139; H01L 21/32; H01L 21/312; H01L 21/314;
(Continued)

(56) References Cited

U.S. PATENT DOCUMENTS 8,871,646 B2 * 10/2014 DeVilliers ........... H01L 21/3086
438/694
9,012,326 B2   4/2015 Kim et al.
(Continued)

FOREIGN PATENT DOCUMENTS

CN   102881566 A   1/2013
CN   103247577 A   8/2013
(Continued)

OTHER PUBLICATIONS

Chang, Title of Invention: Layout of Semiconductor Structure, Semiconductor Device and Method of Forming the Same, U.S. Appl. No. 15/857,642, filed Dec. 29, 2017.
(Continued)

*Primary Examiner* — Chuong A Luu
(74) *Attorney, Agent, or Firm* — Winston Hsu

(57) ABSTRACT

A semiconductor device and a method of forming the same, the semiconductor includes a substrate and a material disposed on the substrate. The material layer includes plural first patterns arranged parallel and separately in an array within a first region of the substrate, and plural second patterns parallel and separately disposed at two opposite sides of the first patterns, and plural third patterns parallel and separately disposed at another two opposite sides of the first patterns, wherein each of the third patterns has a relative greater dimension than that of each of the first patterns.

12 Claims, 9 Drawing Sheets

(51) Int. Cl.
*H01L 27/108* (2006.01)
*H01L 21/3213* (2006.01)

(58) Field of Classification Search
CPC . H01L 21/027; H01L 21/033; H01L 21/0338;
H01L 21/0274; H01L 21/0279; H01L
21/3128; H01L 21/3185; H01L 21/7681;
H01L 21/308; H01L 21/3088; H01L
21/467; H01L 21/475; H01L 21/469;
H01L 21/31144; H01L 21/47576; H01L
21/0273; H01L 21/76811; H01L 27/1085;
H01L 27/10855; H01L 27/10885; H01L
21/3213; H01L 21/108
USPC .................................. 257/774; 438/629, 637
See application file for complete search history.

(56) References Cited

U.S. PATENT DOCUMENTS

| | | | |
|---|---|---|---|
| 9,406,511 B2* | 8/2016 | Huang | H01L 21/76816 |
| 9,490,136 B1* | 11/2016 | Chang | H01L 21/0337 |
| 2003/0085420 A1 | 5/2003 | Ito et al. | |
| 2006/0263699 A1 | 11/2006 | Abatchev et al. | |
| 2008/0280105 A1 | 11/2008 | Kloosterman | |
| 2010/0009512 A1 | 1/2010 | Fishburn | |
| 2010/0112463 A1 | 5/2010 | Yune | |
| 2013/0309871 A1 | 11/2013 | DeVilliers | |
| 2015/0111380 A1* | 4/2015 | Chang | H01L 21/31138 438/674 |
| 2015/0214247 A1* | 7/2015 | Qin | G02F 1/1362 257/72 |
| 2017/0025420 A1* | 1/2017 | Park | H01L 27/10852 |
| 2017/0062349 A1* | 3/2017 | Wang | H01L 23/544 |
| 2017/0092494 A1* | 3/2017 | Zhang | H01L 21/0332 |
| 2017/0186613 A1 | 6/2017 | Kim et al. | |
| 2018/0052387 A1* | 2/2018 | Nozawa | G03F 1/80 |

FOREIGN PATENT DOCUMENTS

| | | |
|---|---|---|
| CN | 106486419 A | 3/2017 |
| CN | 110534525 A | 12/2019 |
| KR | 10-2010-0007387 A | 1/2010 |
| KR | 10-2011-0108734 A | 10/2011 |
| TW | 525224 | 3/2003 |
| TW | 201003734 A1 | 1/2010 |
| WO | 2010005670 | 1/2010 |

OTHER PUBLICATIONS

Chang, Title of Invention: Method of Forming Semiconductor Device, U.S. Appl. No. 15/801,308, filed Nov. 1, 2017.

* cited by examiner

SEMICONDUCTOR DEVICE AND METHOD OF FORMING THE SAME

BACKGROUND OF THE INVENTION

1. Field of the Invention

The present invention relates to a semiconductor device and a method of forming a semiconductor device, and more particularly to a semiconductor device being formed through a multiple patterning process and a method of forming the same.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purpose, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a semiconductor device and a method of forming the same, in which a multiple patterning process is utilized to form staggered grid patterns. That is, a smaller, more densely packed semiconductor structure may be formed under a simplified process flow by using a reduced number of photomasks.

To achieve the purpose described above, the present invention provides a semiconductor device including a substrate and a material layer. The material layer is disposed on the substrate, and the material layer includes a plurality of first patterns, a plurality of second patterns and a plurality of third patterns. The first patterns and the second patterns are parallel and separately arranged in an array arrangement, the second patterns are disposed at two opposite sides of the first patterns, the third patterns are parallel and separately disposed at another two opposite of the first patterns, with a dimension of each of the third patterns being greater than that of each of the first patterns.

To achieve the purpose described above, the present invention provides a method of forming a semiconductor device including the following steps. Firstly, a substrate is provided. Next, a material layer is formed on the substrate. Then, the material layer is patterned to forming a plurality of first patterns, a plurality of second patterns and a plurality of third patterns. The first patterns and the second patterns are parallel and separately arranged in an array arrangement, the second patterns are formed at two opposite sides of the first patterns, the third patterns are parallel and separately formed at another two opposite of the first patterns, with a dimension of each of the third patterns being greater than that of each of the first patterns.

The method of the present invention forms the grids-shaped openings which are staggered but not completely overlapping with each other, so as to pattern the target layer into patterns in further smaller dimension, for example with the pitch of the formed patterns being about 65-70 nanometers, but not limited thereto. That is, the forming method of the present invention is allowable to form the finer structure with a smaller, more densely packed layout without using a complicated sidewall image transferring (SIT) technique, so as to achieve the purpose of simplify the process flow and cost down. In this way, the aforementioned forming method of the invention may be practical applied on a semiconductor process, for example a process of a semiconductor memory device like a dynamic random access memory (DRAM) device, to form conductive pads which are electrically connected to each storage node contact (SNC).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first embodiment of the present invention, in which:

FIG. 1 shows a schematic photomask of the method forming a semiconductor device according to the first embodiment of the present invention;

FIG. 2 shows a schematic view of a semiconductor device after forming a photoresist structure;

FIG. 3 shows a schematic view of a semiconductor device after forming another photoresist structure;

FIG. 4 shows a schematic view of a semiconductor device after performing the other photoresist structure;

FIG. 5 shows a schematic view of a semiconductor device after performing patterns.

FIG. 9 to FIG. 10 are schematic diagrams illustrating a method of forming a semiconductor device according to a fourth embodiment in which:

FIG. 9 shows a schematic photomask of the method forming a semiconductor device according to the fourth embodiment of the present invention;

FIG. 10 shows a schematic view of a semiconductor device after forming patterns.

DETAILED DESCRIPTION

To provide a better understanding of the presented invention, preferred embodiments will be described in detail. The preferred embodiments of the present invention are illustrated in the accompanying drawings with numbered elements.

Figure 1:
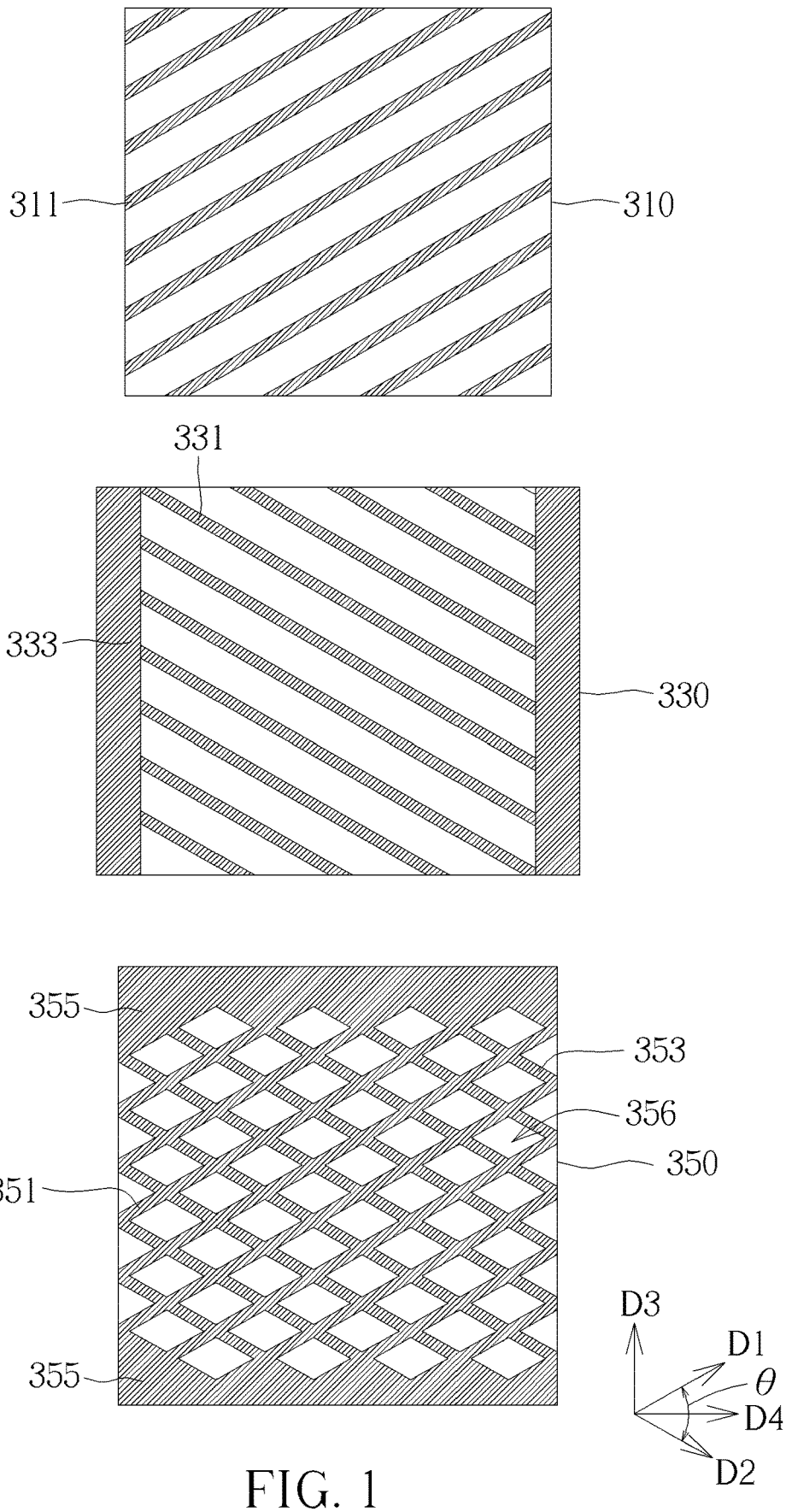

Please refer to FIG. 1 to FIG. 5, which are schematic diagrams illustrating a forming process of a semiconductor device according to the first embodiment of the present invention, wherein FIG. 1 shows photomasks used in the forming method; FIGS. 2-5 respectively show a semiconductor device during the forming process, and each of which includes a top view illustrating a semiconductor device in each forming step at a top portion thereof and a cross-sectional view taken along the cross line A-A' at the bottom portion thereof.

Figure 2:
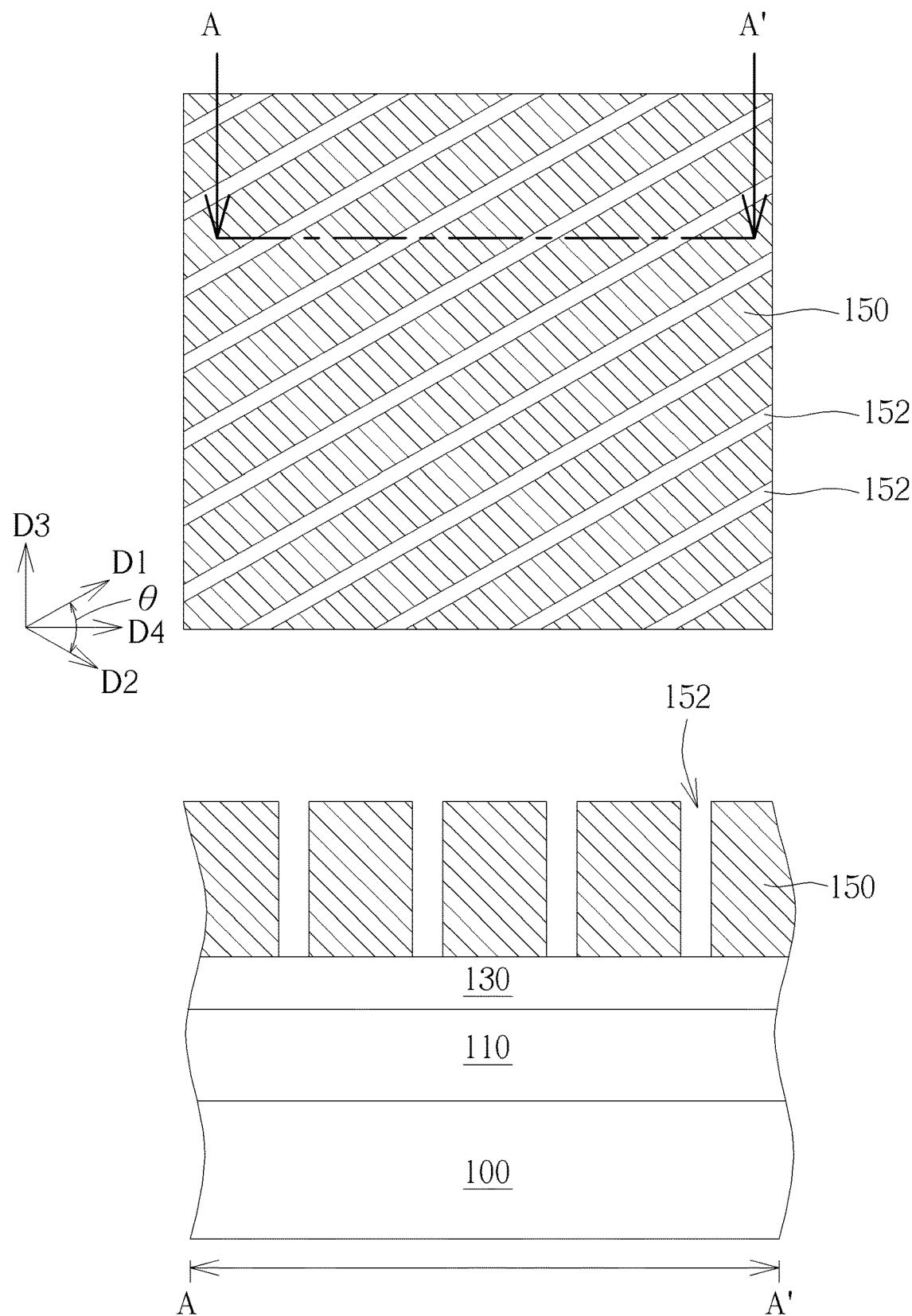

First of all, a substrate 100 is provided, and the substrate 100 for example includes a semiconductor substrate (not shown in the drawings) like a silicon substrate, a silicon containing substrate or a silicon-on-insulator (SOI) substrate. In one embodiment, a first region (not shown in the drawings) such as a core region, and a second region (not shown in the drawings) such as a periphery region surrounding the first region, are further defined on the substrate 100. Then, plural stacked layers are formed on the substrate 100, for example, including a material layer 110 and a hard mask layer 130 stacked from bottom to top, as shown in FIG. 2. The hard mask layer 130 for example includes a material like silicon nitride, and the material layer 110 namely includes a target layer which is tended to be patterned in the forming process and may include any possible material, for example including a conductive layer including a metal material like tungsten (W), copper (Cu), or aluminum (Al), or a dielectric layer including a dielectric material like silicon oxide or silicon nitride, but not limited thereto.

Figure 3:
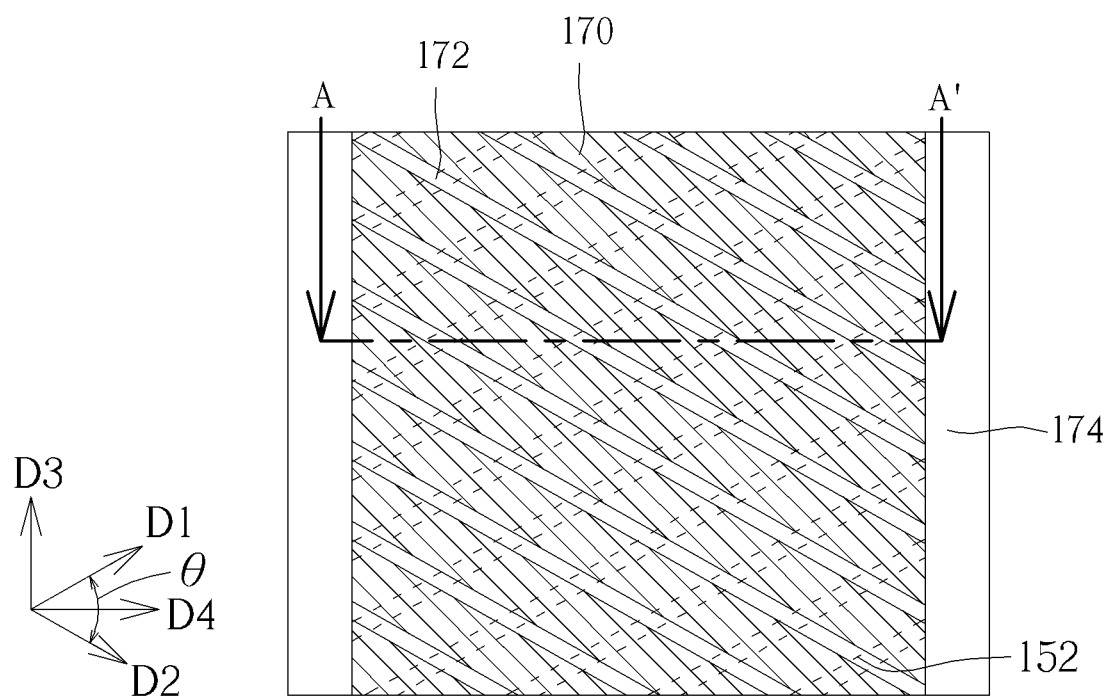
Figure 3:
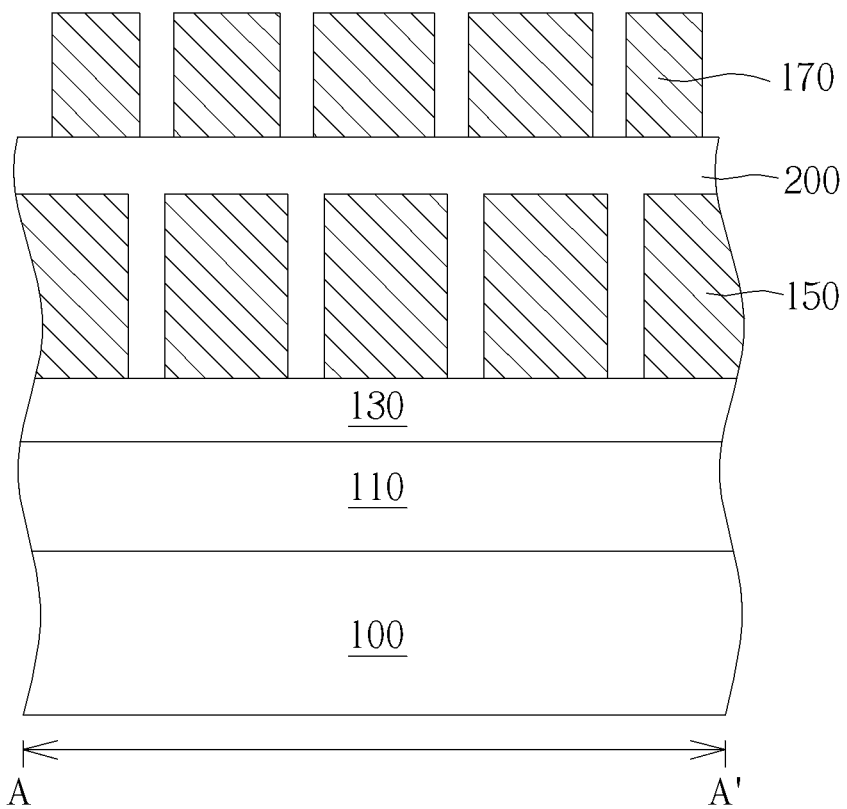

Next, photomasks 310, 330, 350 as shown in FIG. 1 are sequentially used to form corresponding photoresist structure on the substrate 100, for patterning the stacked layers (including the hard mask layer 130 and the material layer 110) underneath. Precisely, the photomask 310 defines a plurality of photomask patterns 311 which is parallel extended along a direction D1, so that, the photomask 310 is used to form a first photoresist structure (not shown in the drawings) on the substrate 100, with the first photoresist structure at least including a photoresist layer (not shown in the drawings), an anti-reflection layer (not shown in the drawings) and a sacrificial layer (not shown in the drawings) stacked from top to bottom. In the present embodiment, a plurality of photoresist patterns (not shown in the drawings) corresponding to the photomask patterns 311 are formed on the photoresist layer, so that, a first etching process may be performed through the first photoresist structure, to form a plurality of corresponding opening patterns 152 in a mask layer 150, as shown in FIG. 2. The photomask 330 defines a plurality of photomask patterns 331 which is parallel extended along a direction D2, and two photomask patterns 333 which are parallel extended at two opposite sides of the photomask patterns 331, along a direction D3 (preferably a y direction), with the three directions D1, D2, D3 are all different from each other, with the direction D1 preferably across the direction D2 to form a cross angle about 60-120 degrees, but not limited thereto. Then, after removing the first photoresist structure and sequentially forming a sacrificial layer 200 and a mask layer 170 on the mask layer 150, the photomask 330 is used to form a second photoresist structure (not shown in the drawings), with the second photoresist structure at least including a photoresist layer (not shown in the drawings), an anti-reflection layer (not shown in the drawings) and a sacrificial layer (not shown in the drawings) stacked from top to bottom. In the present embodiment, a plurality of photoresist patterns (not shown in the drawings) corresponding to the photomask patterns 331, 333 are formed on the photoresist layer, so that, a second etching process may be performed through the second photoresist structure, to form a plurality opening patterns 172 and two opening patterns 174 in the mask layer 170, as shown in FIG. 3. The opening patterns 172 are parallel extended along the direction D2, being corresponding to the photomask patterns 331, and the opening patterns 174 are parallel extended along the direction D3, at two opposite sides of the opening patterns 172, being corresponding to the photomask patterns 333.

Figure 4:
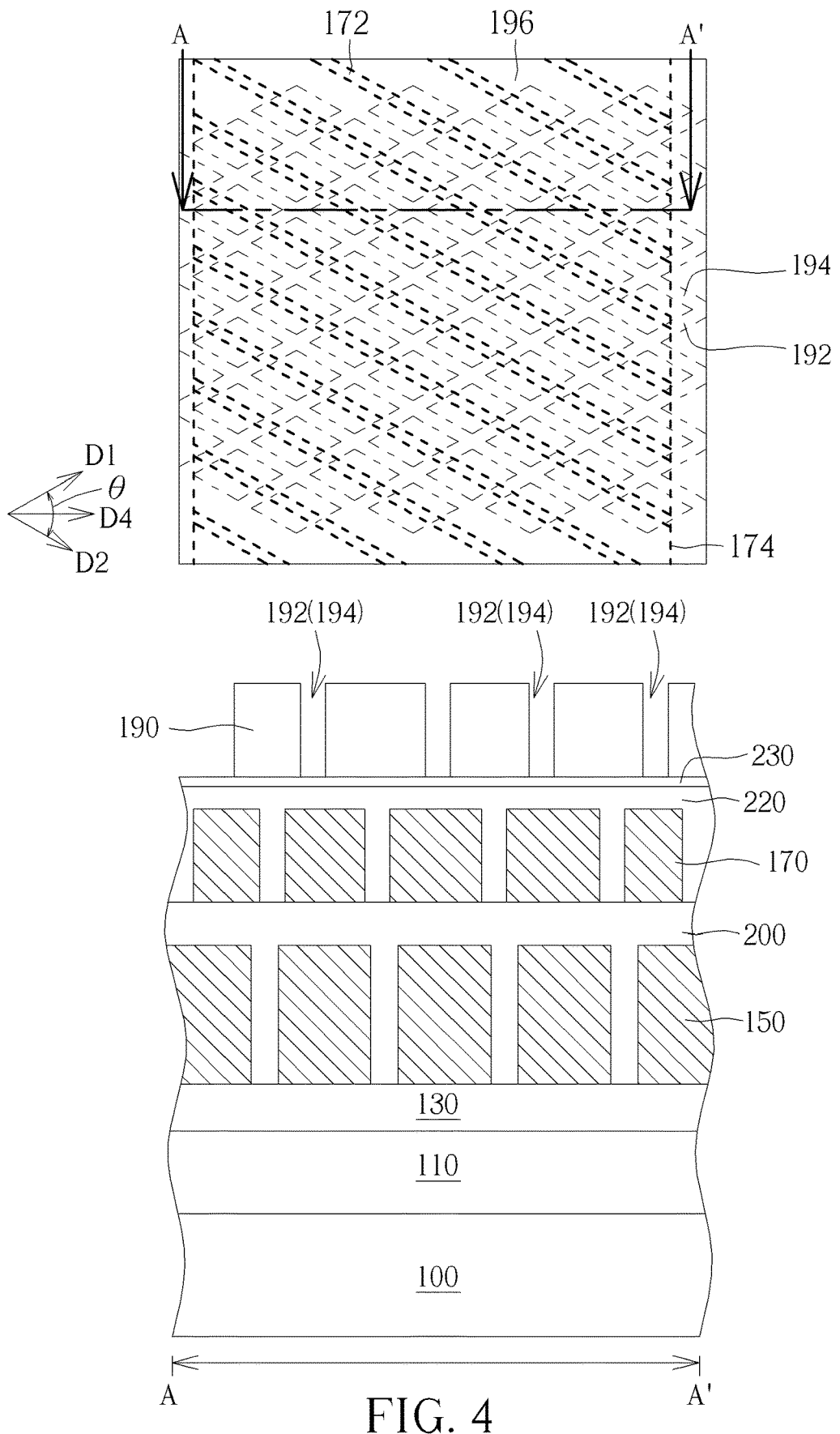

Also, the photomask 350 simultaneously defines a plurality of photomask patterns 351 parallel extended along the direction D1, a plurality of photomask patterns 353 parallel extended along the direction D2, and two photomask patterns 355 parallel extended along a direction D4 (being different from the directions D1, D2, D3), at two opposite sides of the photomask patterns 351, 353, so that, a plurality of grids 356 is formed by the crossed photomask patterns 351, 353, as shown in FIG. 1. In the present embodiment, the photomask patterns 351, 353 are preferably not overlapped with the photomask patterns 311, 331 respectively in a projecting direction (not shown in the drawings) perpendicular to the substrate 100, and which are preferably alternately arranged with the photomask patterns 311, 331 within the same pitch (not shown in the drawings). Also, in the present embodiment, the photomask patterns 355 are extended along the direction D4 (such as the x-direction) which is perpendicular to the direction D3 (such as the y-direction), to merge with a portion of the grids 356 at two opposite sides of the photomask 350, so that, each of the photomask patterns 355 may therefore obtain a jagged edge at the side adjacent to the grids 356, as shown in FIG. 1. Then, the photomask 350 is used to form a third photoresist structure on the mask layer 170, with the third photoresist structure at least including a sacrificial layer 220, an anti-reflection layer 230 and a photoresist layer 190 stacked from bottom to top. In the present embodiment, a plurality of opening patterns 192, 194 corresponding to the photomask patterns 351, 353 and two opening patterns 196 corresponding to the photomask patterns 355 are formed on the photoresist layer 190, as shown in FIG. 4, with the opening patterns 192, 194 being parallel extended along the direction D1, D2 respectively, and with the opening patterns 196 being parallel extended along the direction D4, at two opposites of the opening patterns 192, 194.

In this way, through each photoresist structure being formed from the photomasks 310, 330, 350 respectively, a plurality of grids (not shown in the drawings) with a finer dimension may be formed thereby in the projecting direction. Subsequently, a third etching process is performed to simultaneously transfer the opening patterns 192, 194, 196 of the photoresist layer 190, the opening patterns 172, 174 of the mask layer 190, and the opening patterns 152 of the mask layer 150 into the hard mask layer 130 and the material layer 110 underneath, so as to form corresponding grid-shaped openings in the material layer 110. Thus, the material layer 110 is therefore patterned into a plurality of patterns 111 with a rhombus shape as shown in FIG. 5.

Precisely, speaking, each patterns 111 are separately and regularly arranged on the substrate 100 to obtain the same pitch P1 in the directions D1, D2, for example being about 65-70 nanometers, but not limited thereto. Generally, each of the patterns 111 has the same dimension, and however, patterns 111a disposed at two opposite edges (for example the left side and the right side) usually have a relative smaller dimension due to being restricted by the opening patterns 174 to present an incomplete profile. Among these, patterns ill with completely profile are regularly arranged along the direction D3 to form a plurality of odd columns C11, C12, C13, C14, C15, C16, C17, C17, C18 and a plurality of even columns C21, C22, C23, C24, C25, C26, C27, with patterns 111 arranged within each odd columns C11, C12, C13, C14, C15, C16, C17, C17, C18 being in alignment with each other, with patterns 111 arranged within each even columns C21, C22, C23, C24, C25, C26, C27 also being in alignment with each other, and with patterns ill arranged within adjacent odd column and even column being misaligned with each other, for example, within a misalignment of about ½ pitch P1 in the direction D4, but not limited thereto. For example, patterns 111 arranged within the odd column C11 and the even column C21 adjacent thereto are misaligned with each other, as shown in FIG. 5.

Figure 5:
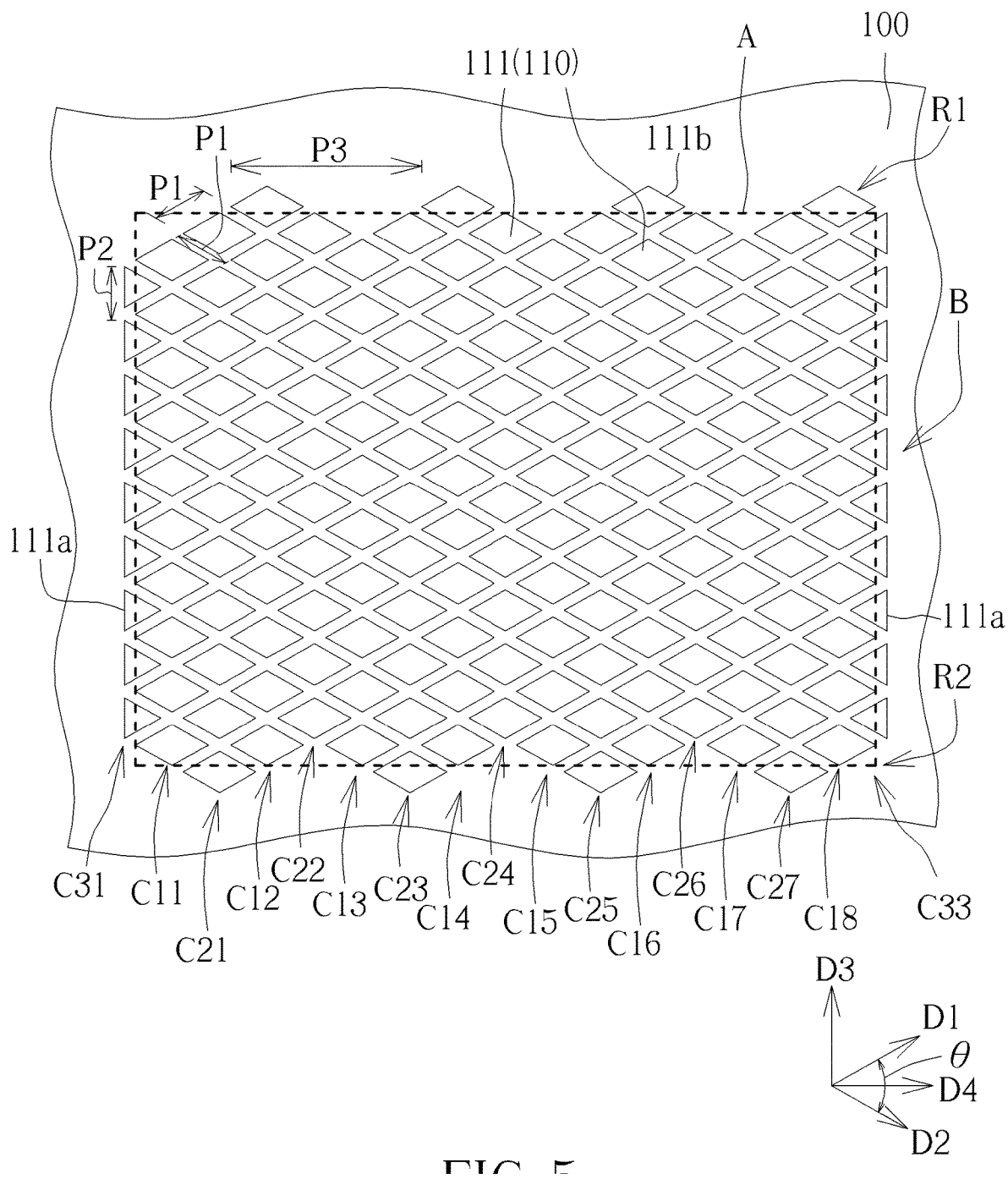

On the other hand, patterns 111 with complete profile are preferably all disposed within a first region A (such as a core region), and patterns 111a with incomplete profile are rather disposed within a second region B (such as a periphery region) or disposed at a boundary between the first region A and the second region B, as shown in FIG. 5. In addition, the patterns 111a with incomplete profile are also regularly arranged along the direction D3 to form two columns C31, C33 to obtain the same pitch P2 in the direction D3, for example being about 75-80 nanometers, but not limited thereto. Also, the patterns 111a arranged within the columns C31, C33 are in alignment with each other along the direction D4, and which are misaligned with patterns 111 disposed within adjacent odd columns C11, C18, for example, within a misalignment of about ½ pitch P2 in the direction D3, but not limited thereto.

Furthermore, the formation of each patters 111 is not only restricted by the opening patterns 174, but also be further restricted by the opening patterns 196, so that, a portion of the patterns 111b disposed at another two opposite edges (such as the top side and the bottom side) may barely retain a complete profile but is partially disposed within the first region A, as shown in FIG. 5. The patterns 111b are disposed at another two opposite sides (such as the top side and the bottom side) of the patterns 111 with complete profile, and which are regular arranged along the direction D4 to form two rows R1, R2, with the patterns 111b arranged in the two rows R1, R2 having the same pitch P3 along the direction D4, for example being about 4-5 times greater than that of the pitches P1, P2, but not limited thereto. Also, in the present embodiment, the patterns 111b disposed within each row R1, R2 are aligned with the patterns 111 disposed within each odd column C12, C14, C16, C18, and which are misaligned with the patterns disposed within each even column C21, C22, C23, C24, C25, C26, C27, as shown in FIG. 5.

It is noted that, although the patterns 111, 111b are exemplified to be formed in the rhombus shape, the practical shapes thereof are not limited thereto and which may be adjusted by modifying the conditions of the exposure process, the development process, the etching process and other processes that have been performed. Accordingly, the shape of each of the patterns 111 may therefore be rounding to present a round shape or an oval shape (not shown in the drawings). Similarity, although the patterns 111a with incomplete profile are exemplified to be formed in a triangle shape, the practical shape thereof may also be adjusted by modifying the conditions of the exposure process, the development process, the etching process and other processes, to rounding the shape thereof.

According to the above processes, the forming method of the first preferred embodiment is accomplished. In the present embodiment, the photomasks 310, 330, 350 as shown in FIG. 1 are sequentially used to form corresponding photoresist structures on the substrate 100, and the corresponding photoresist structures are then used to define various openings 152, 172, 174, 192, 194, 196 extended along different directions D1, D2, D3, D4. The openings 152, 174 and openings 192, 194 enable to form various grid-shaped openings (not shown in the drawings) which are staggered and not completely overlapping with each other in the projecting direction. Thus, while simultaneously transferring the corresponding photoresist structures into the material layer 110 underneath, the material layer 110 may therefore be patterned into patterns 111 with a smaller dimension than that of the grid-shaped openings, for example with the pitch P1 of each pattern 111 being about 65-70 nanometers, but not limited thereto. In other words, the forming method of the present embodiment is mainly accomplished by performing a triple-patterning and triple-etching (3P3E) process, to form the grid-shaped openings which are staggered and not completely overlapped with each other in the projecting direction. That is, it is allowable to form the finer structure with a smaller, more densely packed layout under a simplified and cost-reduced process flow without using a complicated sidewall image transferring (SIT) technique.

People skilled in the arts may fully understand that the forming method of the present invention is not limited to be achieved through the aforementioned process, and may also include other process. For example, in one embodiment, the hard mask layer 130 may be omitted for directly patterning the material layer 110 underneath, or the photomask may include other patterns based on the product requirements. The following description will detail the different embodiments of the forming method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
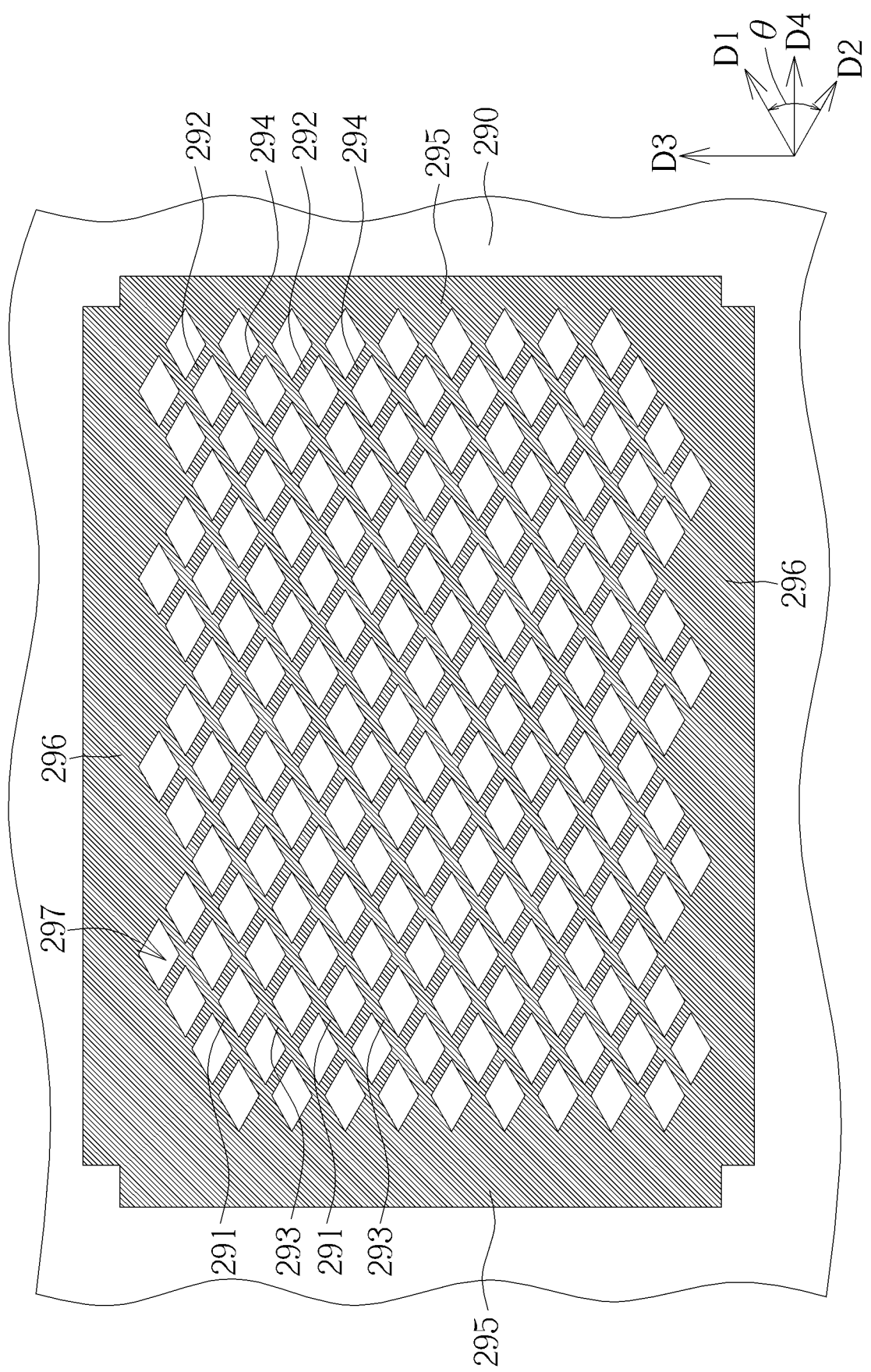
FIG. 6 to FIG. 7 are schematic diagrams illustrating a method of forming a semiconductor device according to a second embodiment.
Figure 7:
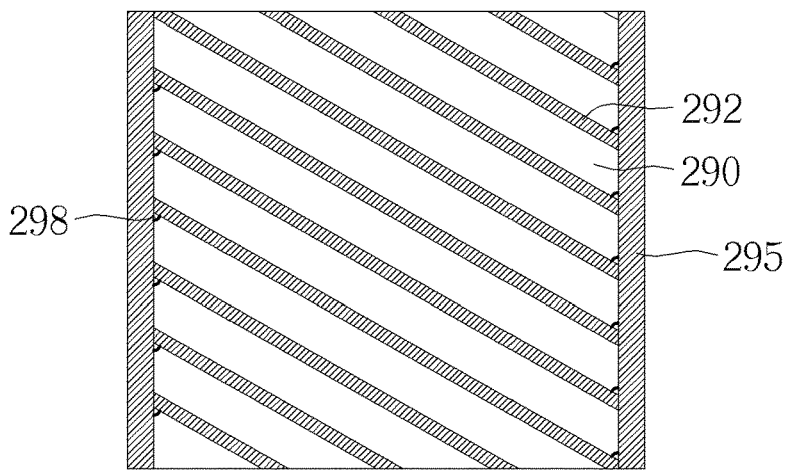

Please refer to FIGS. 6-7, which are schematic diagrams illustrating a forming process of a semiconductor device according to the second embodiment of the present invention, wherein FIGS. 6-7 respectively showing a schematic top view of a photoresist structure used in the forming method. The formal steps in the present embodiment are similar to those in the first embodiment, and which will not redundantly described herein. The differences between the present embodiment and the aforementioned first embodiment are that, the forming method of the aforementioned embodiment uses three photomasks 310, 330, 350 to form each corresponding photoresist structure respectively on the substrate 100, and the forming method of the present embodiment uses the three photomasks 310, 330, 350 to form corresponding photoresist patterns 291, 292, 293, 294, 295, 296 on a photoresist layer 290 of the same photoresist structure (not shown in the drawings) followed by patterning the photoresist layer 290 to form corresponding opening patterns (not shown in the drawings) therein through such photoresist patterns 291, 292, 293, 294, 295, 296. Precisely, the photoresist patterns 291 are corresponding to the photomask patterns 311 of the photomask 310, the photoresist patterns 292, 295 are corresponding to the photomask patterns 331, 333 of the photomask 330, the photoresist patterns 293, 294, 296 are corresponding to the photomask patterns 351, 353, 355 of the photomask 350, so that, a plurality of grids 297 with a finer dimension than that of the grids 356 of the photomask 350 may be direction formed on the photoresist layer 290, as shown in FIG. 6.

Under such performance, after patterning the photoresist layer 290, an etching process is then performed to transfer the photoresist patterns 291, 292, 293, 294, 295, 296 into a mask layer (not shown in the drawings) at one time to form corresponding opening patterns (not shown in the drawings), followed by further transferring such opening patterns into the hard mask layer 130 and the material layer 110 underneath. Thus, the patterns 111 as shown in FIG. 5 may also be formed thereby, the detailed arrangements, pitches and features of the patterns 111 are substantially the same as that of the first embodiment, and will not be redundantly described hereinafter.

It is noted that, in one embodiment, while forming the corresponding photoresist patterns 292, 295 on the photoresist layer 290 through the photomask 330, additional photoresist 298 may be easy to remain at the intersections between the photoresist patterns 292, 295, as shown in FIG. 7. Thus, the remained photoresist 298 may cause the opening patterns 295 formed subsequently being easy to derive additional protrusions in the direction D4, and which may become a filling portion that block the adjacent grids 297. The filling portion may further interfere with the patterns 111 formed at the two opposite sides (namely, the left side and the right side), such that further blocking the patterns 111a as shown in the aforementioned embodiment. That is, the patterns 111a may be completely blocked or obtain a further smaller dimension (not shown in the drawings) thereby. For example, the grids 297 disposed at the two opposite sides of the photoresist layer 290 are completely blocked due to the shielding of the filling portion, so that, patterns 111a with incomplete profile will no longer be formed in the subsequent process of the present embodiment.

According to the above processes, the forming method of the second preferred embodiment is accomplished. In the present embodiment, the photomasks 310, 330, 350 as shown in FIG. 1 are remained used to form the corresponding photoresist structure on the substrate 100, and the photoresist layer 290 of the corresponding photoresist structure is used to pattern the material layer 110 underneath at one time to form the patterns 111. In other words, the forming method of the present embodiment uses a triple-patterning and etching 3P1E process to form the grid-shaped openings which are staggered and not completely overlapping with each other in the material layer 110. That is, it is also allowable to form the finer structure with a smaller, more densely packed layout under a more simplified process flow.

Figure 8:
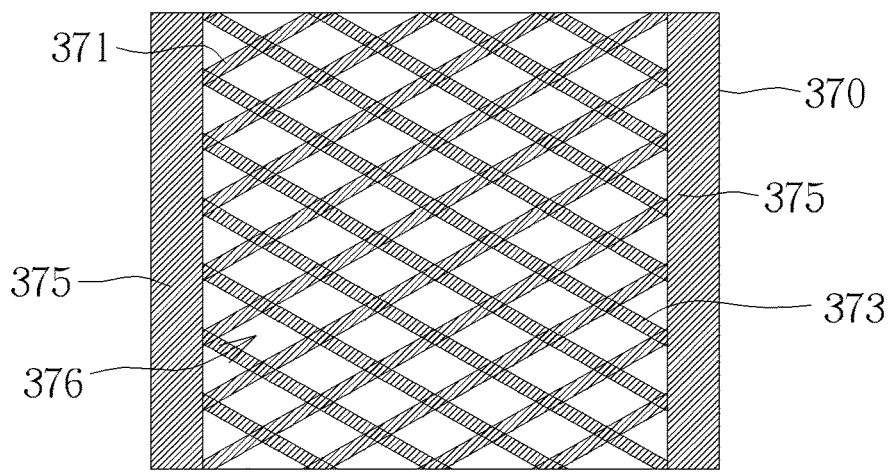
FIG. 8 is a schematic diagram illustrating a method of forming a semiconductor device according to a third embodiment.
Figure 8:
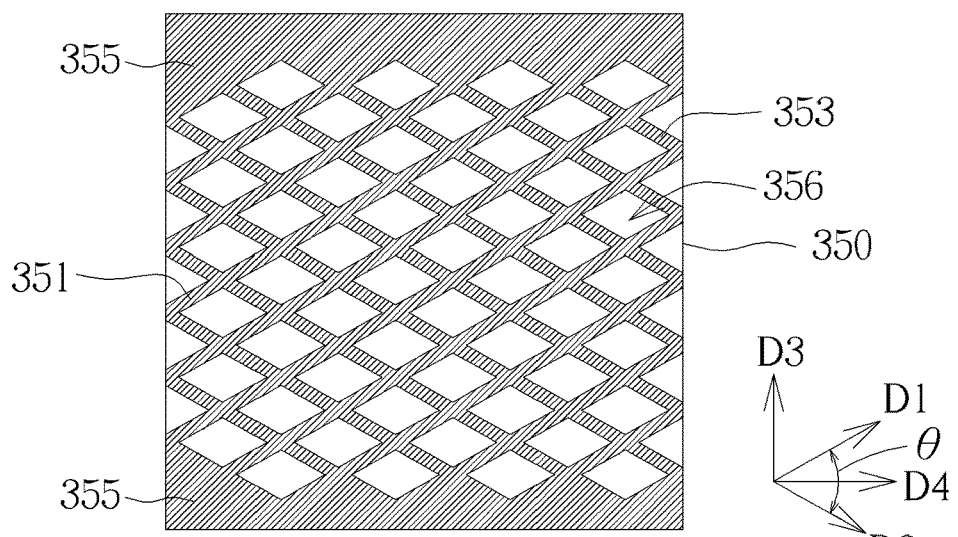

Please refer to FIG. 8, which are schematic diagrams illustrating a forming process of a semiconductor device according to the third embodiment of the present invention. The formal steps in the present embodiment are similar to those in the first embodiment, and which will not redundantly described herein. The differences between the present embodiment and the aforementioned first embodiment are that, the forming method of the present embodiment uses two photomasks 370, 350 to sequentially form corresponding photoresist structures on the substrate 100 to pattern the stacked layers (including the hard mask layer 130 and the material layer 110) underneath. The photomask 370 simultaneously defines a plurality of photomask patterns 371 parallel extended along the direction D1, a plurality of photomask patterns 373 parallel extended along the direction D2, and two photomask patterns 375 parallel extended along the direction D3 (such as the y-direction), at two opposite sides of the photomask patterns 371, 373, so that, a plurality of grids 376 is formed by the crossed photomask patterns 371, 373, as shown in FIG. 8. In the present embodiment, the grids 376 defined on the photomask 370 and the grids 356 defines on the photomask 350 are staged with each other and not completely overlapped with each other, so that, the grids 376, 356 may together define a plurality of grids (not shown in the drawings) with a finer dimension and regularly arranged in the projecting direction, for example as the grids 297 shown in FIG. 6.

With these performances, the patterns 110 as shown in FIG. 5 may also be formed through patterning the hard mask layer 130 and the material layer 110 by using the photoresist structures of the present embodiment, and the detailed arrangements, pitches and features of the patterns 111 are substantially the same as that of the first embodiment and will not be redundantly described hereinafter. According to the above processes, the forming method of the third preferred embodiment is accomplished. In the present embodiment, the photomasks 370, 350 as shown in FIG. 8 are used to form the corresponding photoresist structures on the substrate 100, with the corresponding photoresist structures forming the grid-shaped openings which are staggered and not completely overlapping with each other, respectively. Then, the corresponding photoresist structures are used to patterning the material layer 110 for forming the patterns 111. That is, it is still allowable to form the finer structure with a smaller, more densely packed layout under a more simplified process flow with reduced number of photomasks.

Figure 9:
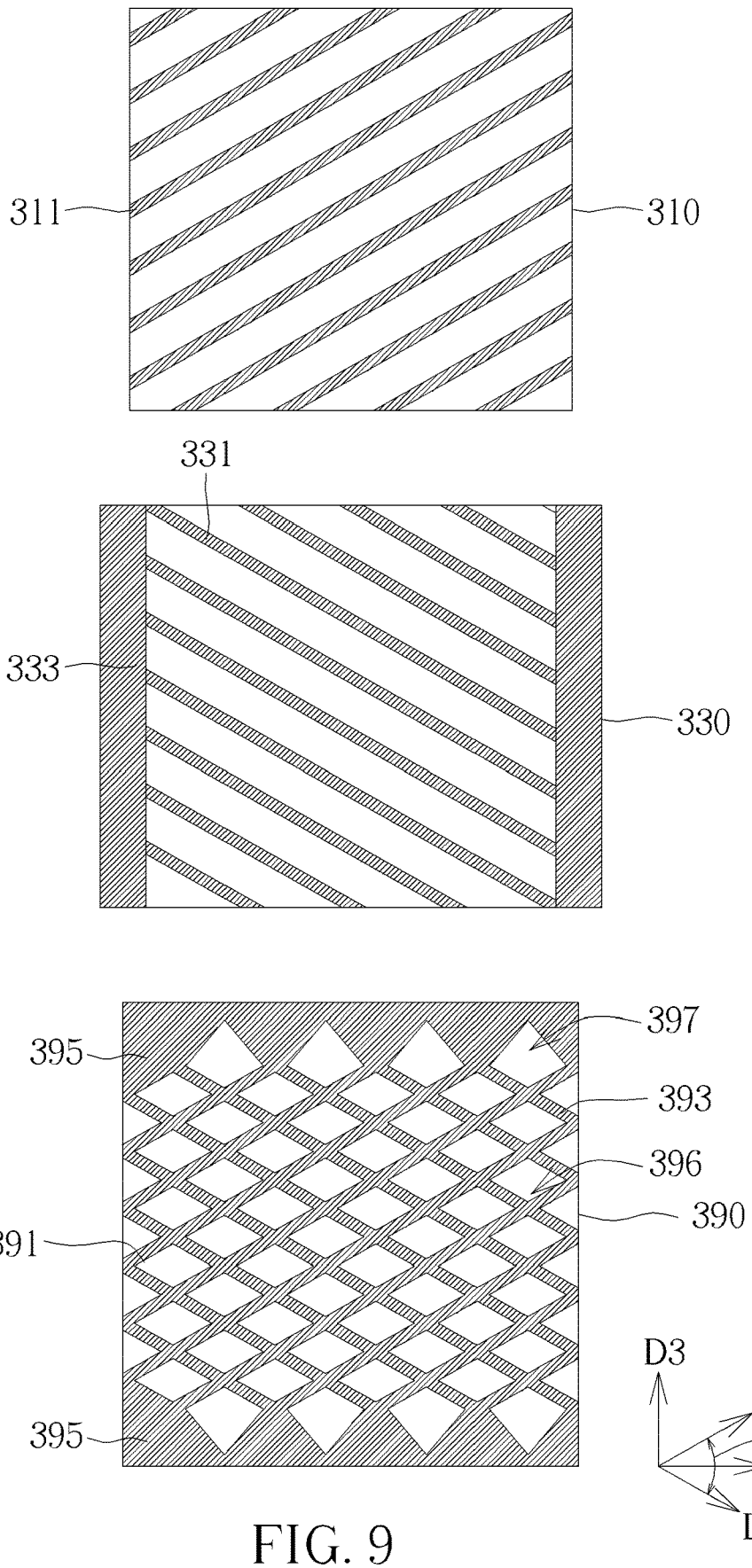
Figure 10:
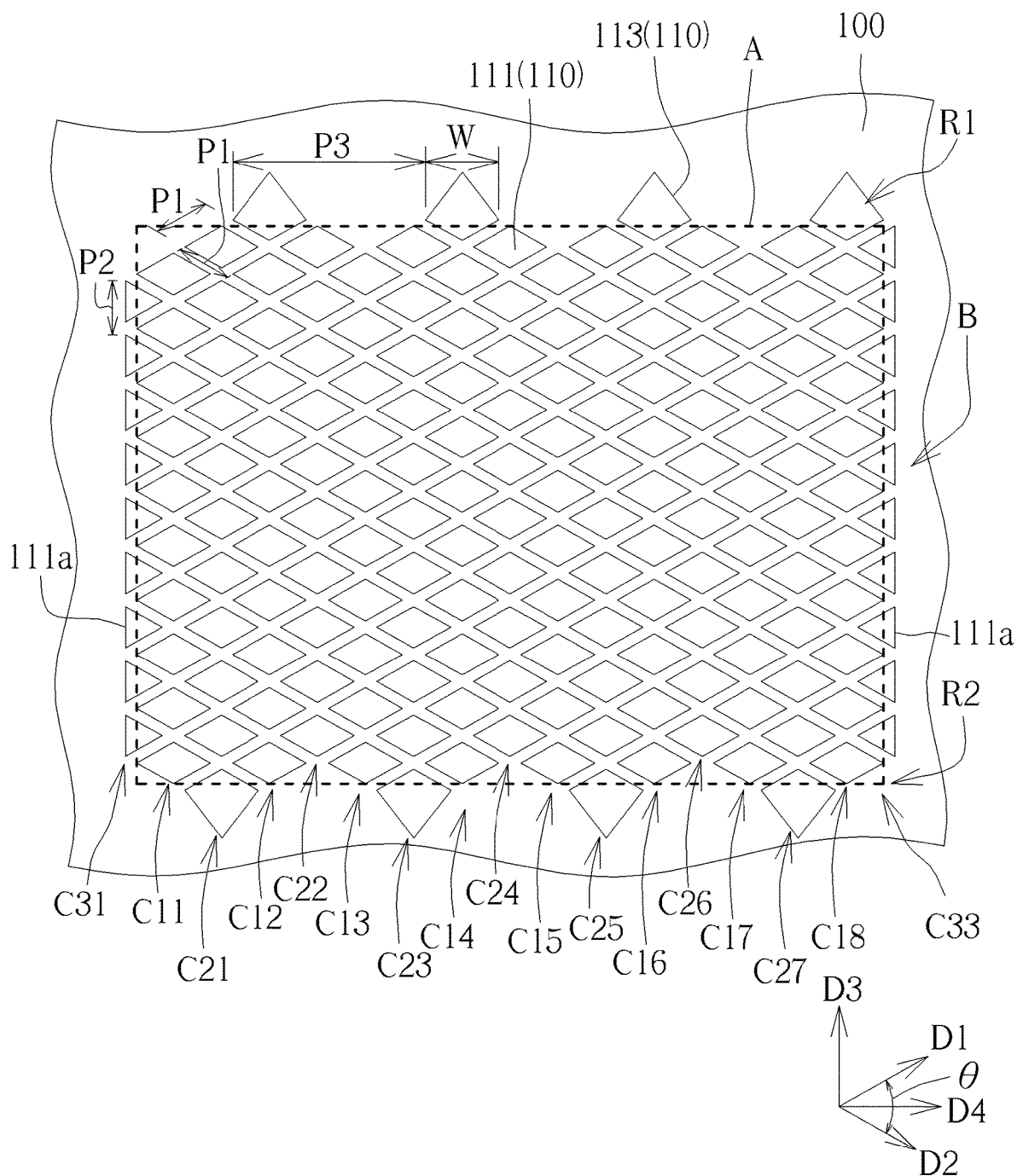

Please refer to FIGS. 9-10, which are schematic diagrams illustrating a forming process of a semiconductor device according to the fourth embodiment of the present invention, wherein FIG. 9 shows the photomask used in the forming method; FIG. 10 shows a schematic top view of a semiconductor device during the forming process. The formal steps in the present embodiment are similar to those in the first embodiment, and which will not redundantly described herein. The differences between the present embodiment and the aforementioned first embodiment are that, the forming method of the present embodiment uses three photomasks 310, 330, 390 to sequentially form corresponding photoresist structures on the substrate 100 to pattern the stacked layers (including the hard mask layer 130 and the material layer 110) underneath. The detailed feature of the photomasks 310, 330 are substantially the same as those of the first embodiment, and which will not be redundantly described hereinafter. The photomask 390 simultaneously defines a plurality of photomask patterns 391 parallel extended along the direction D1, a plurality of photomask patterns 393 parallel extended along the direction D2, and two photomask patterns 395 parallel extended along the direction D4 (such as the x-direction), at two opposite sides of the photomask patterns 391, 393, so that, a plurality of grids 396 is formed by the crossed photomask patterns 391, 393, as shown in FIG. 9.

In the present embodiment, the photomask patterns 395 are merge with a portion of the grids 390 at two opposite sides of the photomask 390, so as to obtain a jagged edge at the side adjacent to the grids 396. It is noted that, the related position between the jagged edge of the photomask patterns 395 and the photomask patterns 391, 393 are further adjusted, so that, the grids 397 disposed adjacent to the two opposite sides of the photomask 390 may therefore obtain a relative greater dimension, as shown in FIG. 9. With these performances, patterns 111, 113 as shown in FIG. 10 may be formed subsequently through patterning the hard mask layer 130 and the material layer 110 by using the photoresist structures of the present embodiment.

Precisely, the detailed arrangements, pitches and features of the patterns 111 are substantially the same as that of the first embodiment and will not be redundantly described hereinafter. However, the patterns 113 arranged in the rows R1, R2 may have a relative greater dimension due to being formed according to the grids 397. In the present embodiment, the patterns 113 are in a diamond-like shape, and each of which has a continuous shrunk width W at a side being away from the patterns 111, with the continuous shrunk width W being continuous shrunk along the direction that is away from the patterns 111 (such as the direction D3), as shown in FIG. 10.

According to the above processes, the forming method of the fourth preferred embodiment is accomplished. In the present embodiment, the photomasks 310, 330, 390 as shown in FIG. 9 are used to form the corresponding photoresist structures on the substrate 100. Then, the corresponding photoresist structures are used to patterning the material layer 110 for forming the patterns 111, 113 with different dimensions in different regions A, B. That is, it is also allowable to form the finer structure with a smaller, more densely packed layout under a more simplified process flow.

Overall speaking, the forming method of the present invention forms the grids-shaped openings which are staggered but not completely overlapping with each other, so as to pattern the target layer into patterns in further smaller dimension, for example with the pitch of the patterns being about 65-70 nanometers, but not limited thereto. That is, the forming method of the present invention is allowable to form the finer structure with a smaller, more densely packed layout without using a complicated sidewall image transferring (SIT) technique, so as to achieve the purpose of simplify the process flow and cost down. In this way, the aforementioned forming method of the invention may be practical applied on a semiconductor process, for example a process of a semiconductor memory device like a dynamic random access memory (DRAM) device, to form the conductive pads which are electrically connected to each storage node contact (SNC). For example, in one embodiment, before performing the aforementioned processes, a plurality of buried gates (not shown in the drawings) is previously formed within the substrate 100 to function like the word lines (WLs, not shown in the drawing), and then, the first region A of the substrate 100 is configured as a memory cell region, and the second region B surrounding the first region A is configured as a periphery region. Then, a dielectric layer (not shown in the drawing) is formed on the substrate 100 and a plurality of bit lines (BLs, not shown in the drawing) and a plurality of plugs (not shown in the drawing) are further formed in the dielectric layer. The material layer 110 is then formed on the dielectric layer, and which may include a low-resistant metal material like tungsten, aluminum or copper. Through this performance, the aforementioned forming method in the present invention may be performed to pattern the material layer 110, thereby forming patterns 111, 113. That is, each of the patterns 111 formed within the first region A may be directly in contact with the plugs underneath respectively, and the patterns 111 may be further in connection with a transistor (not shown in the drawing) of the semiconductor memory device via the plugs, so as to function like a storage node contact (SNC). On the other hands, the patterns 111, 113 disposed within the second region B or disposed at the boundary between the first region A and the second region B, are not in connection with the plugs or in connection with dummy plugs. However, the method of the present invention is not limited to be applied to the semiconductor memory process above, and in another embodiment, the method may also be applied to other semiconductor processes for forming smaller, more densely packed layout or semiconductor structure under a cost-saving and simplified process flow by using fewer photomasks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor device, comprising:
   providing a substrate;
   forming a material layer on the substrate; and
   patterning the material layer to forming a plurality of first patterns, a plurality of second patterns and a plurality of third patterns, wherein, the first patterns and the second patterns are parallel and separately arranged in an array arrangement, the second patterns are disposed at two opposite sides of the first patterns in a first direction, the third patterns are parallel and separately disposed at two opposite sides of the first patterns in a second direction being perpendicular to the first direction, with a dimension of each of the second patterns being smaller than that of each of the first patterns, and with a dimension of each of the third patterns being greater than that of each of the first patterns.

2. The method of forming a semiconductor device according to claim 1, further comprising:
   forming a first photomask on the material layer, the first photomask comprising a plurality of first photomask patterns parallel extending along a third direction being different from the first direction and the second direction;
   forming a second photomask on the material layer, the second photomask comprising a plurality of second photomask patterns parallel extending along a fourth direction which is across to the third direction and not perpendicular thereto;
   forming a third photomask on the material layer, the third photomask comprising a plurality of third photomask patterns parallel extending along the third direction and a plurality of fourth photomask patterns parallel extending along the fourth direction, wherein the third photomask patterns cross the fourth photomask patterns to form a plurality of grids; and
   patterning the material layer through the first photomask, the second photomask and the third photomask.

3. The method of forming a semiconductor device according to claim 2, wherein the third photomask patterns of the third photomask and the first photomask patterns of the first photomask are alternately arranged in the fourth direction within a same pitch.

4. The method of forming a semiconductor device according to claim 2, wherein the fourth photomask patterns of the third photomask and the second photomask patterns of the second photomask are alternately arranged in the third direction within a same pitch.

5. The method of forming a semiconductor device according to claim 2, wherein the second photomask further comprises two fifth photomask patterns extended at two opposite sides of the second photomask patterns in the first direction.

6. The method of forming a semiconductor device according to claim 5, wherein the third photomask further comprises two six photomask patterns extended at two opposite sides of the third photomask patterns and the fourth photomask patterns in the second direction, and an extending direction of the sixth photomask patterns is different from that of the fifth photomask patterns.

7. The method of forming a semiconductor device according to claim 6, wherein a portion of the grids adjacent to the six photomask patterns have a relative greater dimension than that of other of the grids.

8. The method of forming a semiconductor device according to claim 5, further comprising a plurality of filling portions filled in corners between each of the second photomask patterns and the each of the fifth photomask patterns.

9. The method of forming a semiconductor device according to claim 8, wherein the filling portions comprises a photoresist material.

10. The method of forming a semiconductor device according to claim 1, further comprising:
forming a first photomask on the material layer, the first photomask comprising a plurality of first photomask patterns parallel extending along a third direction being different from the first direction and the second direction, and a plurality of second photomask patterns parallel extending along a fourth direction which is across to the third direction and not perpendicular thereto, wherein the first photomask patterns cross over the second photomask patterns to form a plurality of first grids;
forming a second photomask on the material layer, the second photomask comprising a plurality of third photomask patterns parallel extending along the third direction and a plurality of fourth photomask patterns parallel extending along the fourth direction, wherein the third photomask patterns cross over the fourth photomask patterns to form a plurality of second grids; and
patterning the material layer through the first photomask and the second photomask.

11. The method of forming a semiconductor device according to claim 10, wherein the first grids and the second grids are alternately arranged with each other to form a plurality of third grids, the third grids has a relative smaller dimension than that of the first grids and the second grids.

12. The method of forming a semiconductor device according to claim 4, wherein a cross angle between the third direction and the fourth direction is about 60 to 120 degrees.

* * * * *